US011296050B2

(12) United States Patent
Swaminathan

(10) Patent No.: US 11,296,050 B2
(45) Date of Patent: Apr. 5, 2022

(54) CHIP WITH MAGNETIC INTERCONNECT ALIGNMENT

(71) Applicant: Intel Corporation, Santa Clara, CA (US)

(72) Inventor: Rajasekaran Swaminathan, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/644,762

(22) PCT Filed: Sep. 29, 2017

(86) PCT No.: PCT/US2017/054526
§ 371 (c)(1),
(2) Date: Mar. 5, 2020

(87) PCT Pub. No.: WO2019/066944
PCT Pub. Date: Apr. 4, 2019

(65) Prior Publication Data
US 2021/0066240 A1    Mar. 4, 2021

(51) Int. Cl.
*H01L 23/498* (2006.01)
*H01L 23/00* (2006.01)

(52) U.S. Cl.
CPC ........ *H01L 24/81* (2013.01); *H01L 23/49866* (2013.01); *H01L 24/05* (2013.01);
(Continued)

(58) Field of Classification Search
CPC . H01L 2224/13655; H01L 2224/05655; H01L 23/4985
See application file for complete search history.

(56) References Cited

U.S. PATENT DOCUMENTS

2011/0278351 A1* 11/2011 Aleksov .................. H01L 24/81
228/234.1

FOREIGN PATENT DOCUMENTS

JP         11266076 A      9/1999
WO    WO-20110179640 A1    7/2011
(Continued)

OTHER PUBLICATIONS

"International Application Serial No. PCT US2017 054526, International Preliminary Report on Patentability dated Apr. 9, 2020", 10 pgs.

(Continued)

*Primary Examiner* — Dale E Page
*Assistant Examiner* — Wilner Jean Baptiste
(74) *Attorney, Agent, or Firm* — Schwegman Lundberg & Woessner, P.A.

(57) ABSTRACT

An electronic assembly, and a method for making the electronic assembly, includes a first electronic component, a second electronic component, and a plurality of interconnects. The plurality of interconnects electrically couple the first electronic component to the second electronic component. Each of the plurality of interconnects comprise one of a plurality of first magnetic components in physical alignment with an associated one of a plurality of second magnetic components, the plurality of second magnetic components being components of one of the second electronic component and the plurality of interconnects.

8 Claims, 7 Drawing Sheets

(52) U.S. Cl.
CPC .............. *H01L 24/13* (2013.01); *H01L 24/16* (2013.01); *H01L 23/4985* (2013.01); *H01L 2224/05655* (2013.01); *H01L 2224/1357* (2013.01); *H01L 2224/1366* (2013.01); *H01L 2224/13611* (2013.01); *H01L 2224/13655* (2013.01); *H01L 2224/13657* (2013.01); *H01L 2224/16147* (2013.01); *H01L 2224/16227* (2013.01); *H01L 2224/16237* (2013.01); *H01L 2224/8182* (2013.01); *H01L 2224/81143* (2013.01); *H01L 2224/81191* (2013.01); *H01L 2224/81193* (2013.01); *H01L 2224/81801* (2013.01)

(56) References Cited

FOREIGN PATENT DOCUMENTS

| WO | WO-20120014068 A1 | 1/2012 |
| WO | WO-20150115468 A1 | 4/2015 |
| WO | WO-20170148771 A1 | 5/2017 |
| WO | WO-2019066944 A1 | 4/2019 |

OTHER PUBLICATIONS

"International Application Serial No. PCT/US2017/054526, International Search Report dated Jun. 29, 2018".
"International Application Serial No. PCT/US2017/054526, Written Opinion dated Jun. 29, 2018".

* cited by examiner

CHIP WITH MAGNETIC INTERCONNECT ALIGNMENT

This application is a U.S. National Stage Application under 35 U.S.C. 371 from International Application No. PCT/2017/054526, filed Sep. 29, 2017, which is hereby incorporated by reference in its entirety.

TECHNICAL FIELD

The disclosure herein relates generally to an electronic chip with interconnects aligned with a magnetic field.

BACKGROUND ART

Electronic assemblies, such as electronic chips, can include a single die or multiple dies. The dies may be positioned on or with respect to a substrate and electrically coupled with respect to one another using interconnects. Such interconnects are conventionally placed in contact with one another and then soldered or otherwise electrically and mechanically secured together.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The capacity to couple a die to a substrate, or otherwise connect to electronic components together, has been dependent, at least in part, on the ability to couple interconnects of one component, e.g., the die, to interconnects or conductive pads of another components, e.g., the substrate. Because conventional techniques involve manually and intricately positioning the components in alignment with one another and then bringing the interconnects together to electrically and mechanically secure the components together. Because such conventional techniques require such precise manual alignment, it has typically proven impractical to make the size of the interconnects, e.g., the width of the interconnects and conductive pads, smaller than the tens of micrometers, thereby placing limitations on the ultimate size of the die and substrate.

An electronic assembly has been developed that utilizes magnetic positioning of interconnects and interconnect components between two electric components, e.g., a die and a substrate. The interconnect includes magnetic components that, in the presence of a magnetic field, are magnetically attracted to one another. The magnetic attraction inherently draws the interconnect components together, meaning that the need for precision manual alignment is reduced in comparison to conventional techniques while simultaneously providing for relatively greater alignment precision. As a result, the magnetic interconnect alignment allows for much smaller interconnects to be formed, with interconnect widths smaller than one micrometer, including down to fewer than ten nanometers, being possible.

Figure 1:
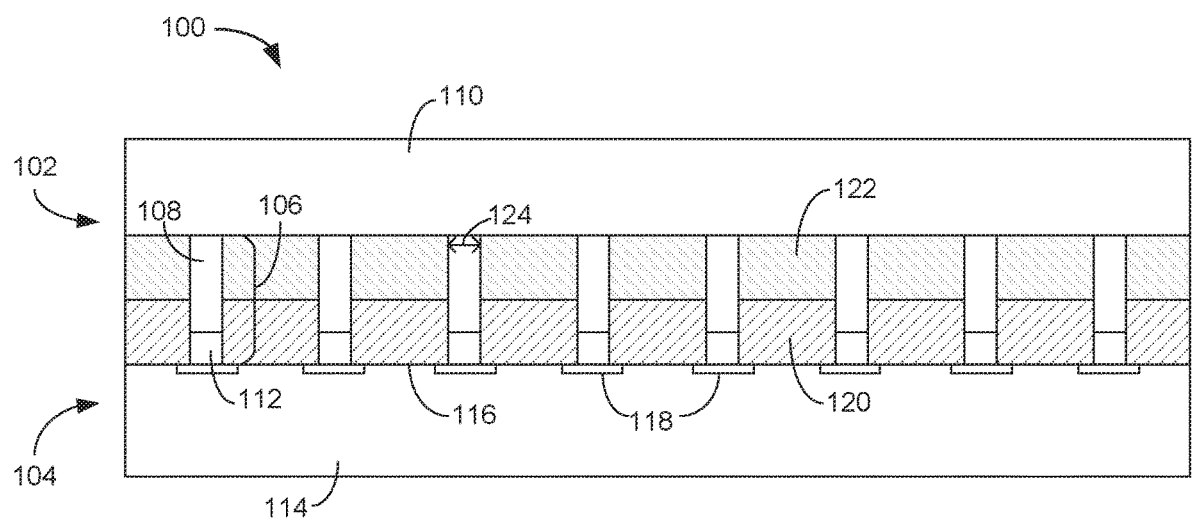
FIG. 1 is a side view of an electronic assembly, in an example embodiment.

FIG. 1 is a side view of an electronic assembly 100, in an example embodiment. The electronic assembly 100 may be an electronic chip or any other suitable structure or assembly. The electronic assembly 100 includes a die 102 and a substrate 104. It is noted and emphasized that while the die 102 and substrate 104 are illustrated herein with specificity, the techniques described may be applied to any two or more electronic components not limited to one die 102 and one substrate 104. As such, substrates may be coupled to one another, dies may be coupled to one another, multiple dies may be coupled to a single substrate, and so forth. Thus, more generically, the die 102 may be understood to be a first electronic component and the substrate 104 may be understood to be a second electronic component.

The die 102 includes interconnects 106. Each interconnect 106 includes one of a plurality of a nonmagnetic conductors 108 mechanically and electrically coupled to the silicon 110 and an associated one of a plurality of first magnetic components, as illustrated conductive magnetic caps 112, electrically and mechanically coupled to the associated nonmagnetic conductor 108. In an example, the nonmagnetic conductor 108 is comprised of copper or other metal or material conventionally understood to be nonmagnetic or substantially nonmagnetic. The conductive magnetic cap 112 is comprised of a magnetic metal or alloy, such as iron, cobalt, nickel, iron-cobalt alloy, iron-nickel alloy, iron-tin alloy, and so forth. The conductive magnetic cap 112 may be coupled to the nonmagnetic conductor 108 via plating, including either electrolytically or electrolessly, by sputtering, by vapor phase deposition, or according to any other suitable mechanism.

The substrate 104 includes a substrate material 114 forming a major surface 116 and a plurality of second magnetic components, as illustrated conductive magnetic pads 118, formed on the major surface 116. The substrate material 114 may be substantially rigid or may be flexible. The conductive magnetic pads 118 may be comprised of any suitable magnetic material, such as nickel, and may be formed as a surface finish on the major surface 116. Each conductive magnetic pad 118 corresponds to an associated one of the interconnects 106 of the die 102. The substrate 104 further includes a buildup layer 120 forming holes (not pictured) into which the interconnects 106 are seated to bring each conductive magnetic cap 112 in contact with the associated conductive magnetic pad 118. The conductive magnetic caps 112 are secured to the conductive magnetic pads 118 using, e.g., solder, thermo-compression bonding, or any other suitable technique. The electronic assembly 100 further optionally includes an underfill layer 122 to add additional mechanical stability between the die 102 and the substrate 104 and to protect the interconnects 106.

Owing to the improved alignment precision offered by the magnetic techniques described herein over conventional, manual techniques, the interconnects 106 in particularly may be smaller than conventional interconnects on other electronic chips. While the techniques described herein may provide for interconnects 106 as large as conventional interconnects, e.g., ten or more micrometers, the interconnects 106 may also have a width 124 of one nanometer or less.

While the techniques related to magnetic alignment of interconnects are described with particularly to the electronic assembly 100, it is to be recognized and understood that the principles described herein are not limited to the specific architecture of the electronic assembly 100 and may further be applied to any suitable architecture. Thus, for instance, the substrate 104 may include the interconnects 106 while the die 102 may include the conductive magnetic pads 118. Each of the die 102 and the substrate 104 may include a mix of interconnects 106 and conductive pads 118. The conductive magnetic pads 118 may be omitted entirely and both the die 102 and the substrate 104 may include interconnects 106 that are brought into alignment using the techniques described herein. Further, alternative examples of the interconnects 106 are contemplated that omit the nonmagnetic conductor 108 altogether.

Figure 2A:
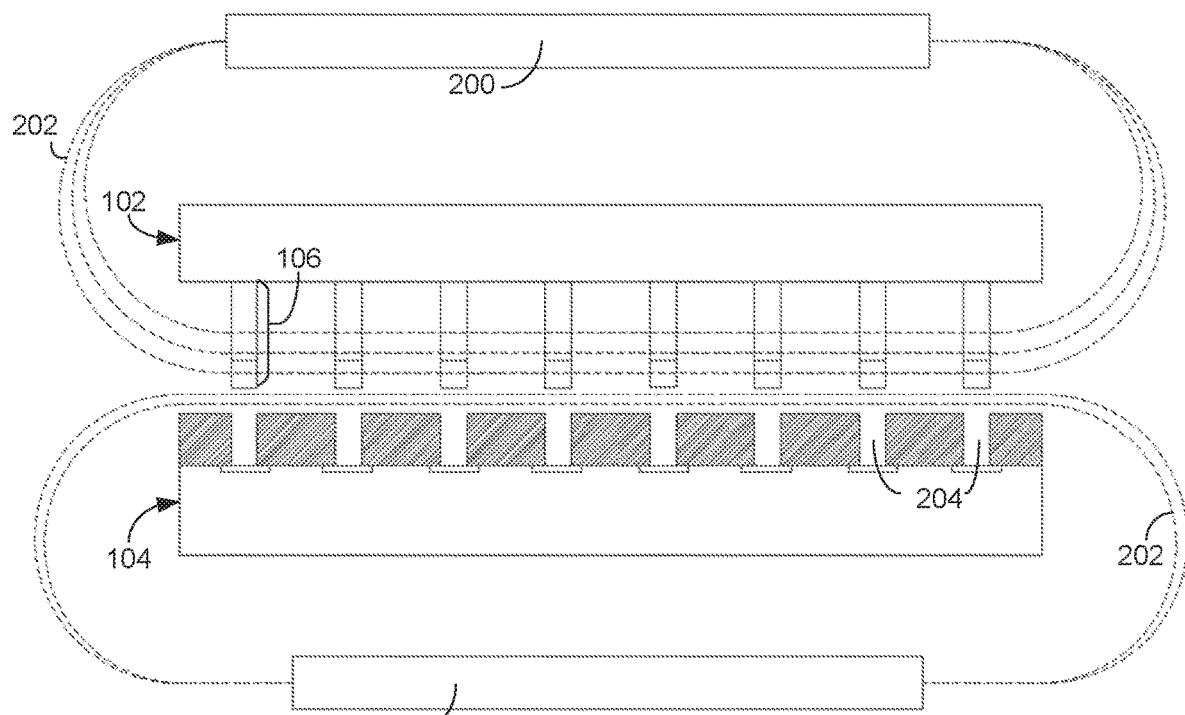
FIGS. 2A-2C illustrate a process for making an electronic assembly, in an example embodiment.
Figure 2B:
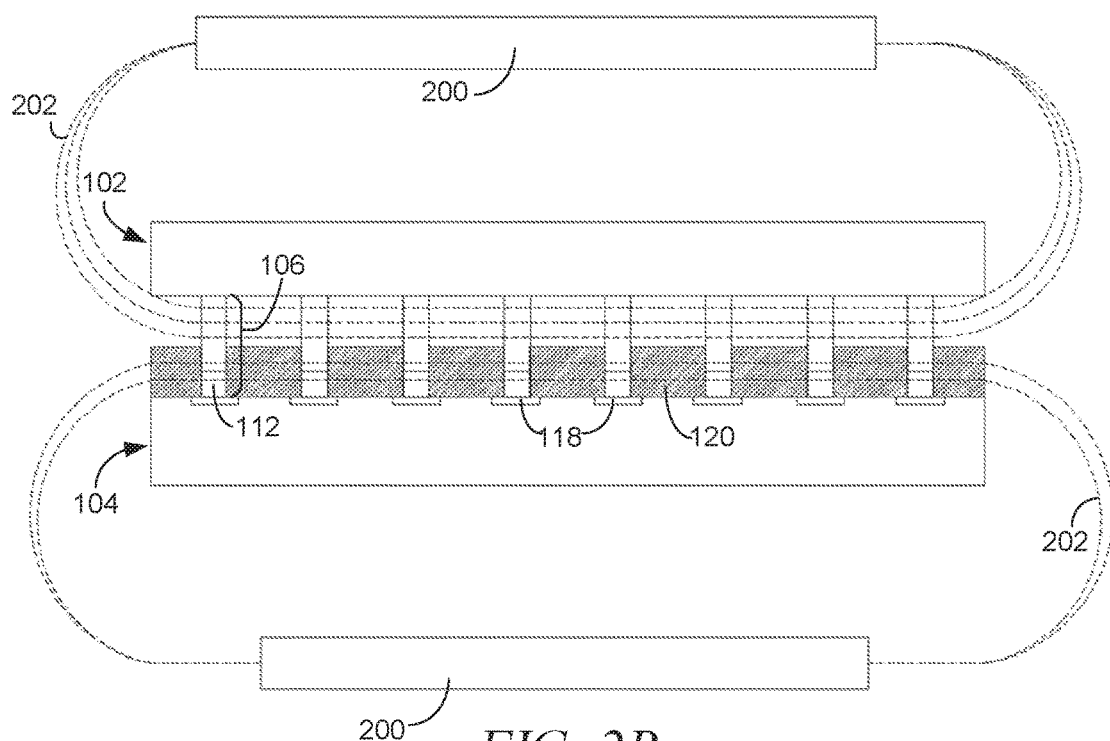
Figure 2C:
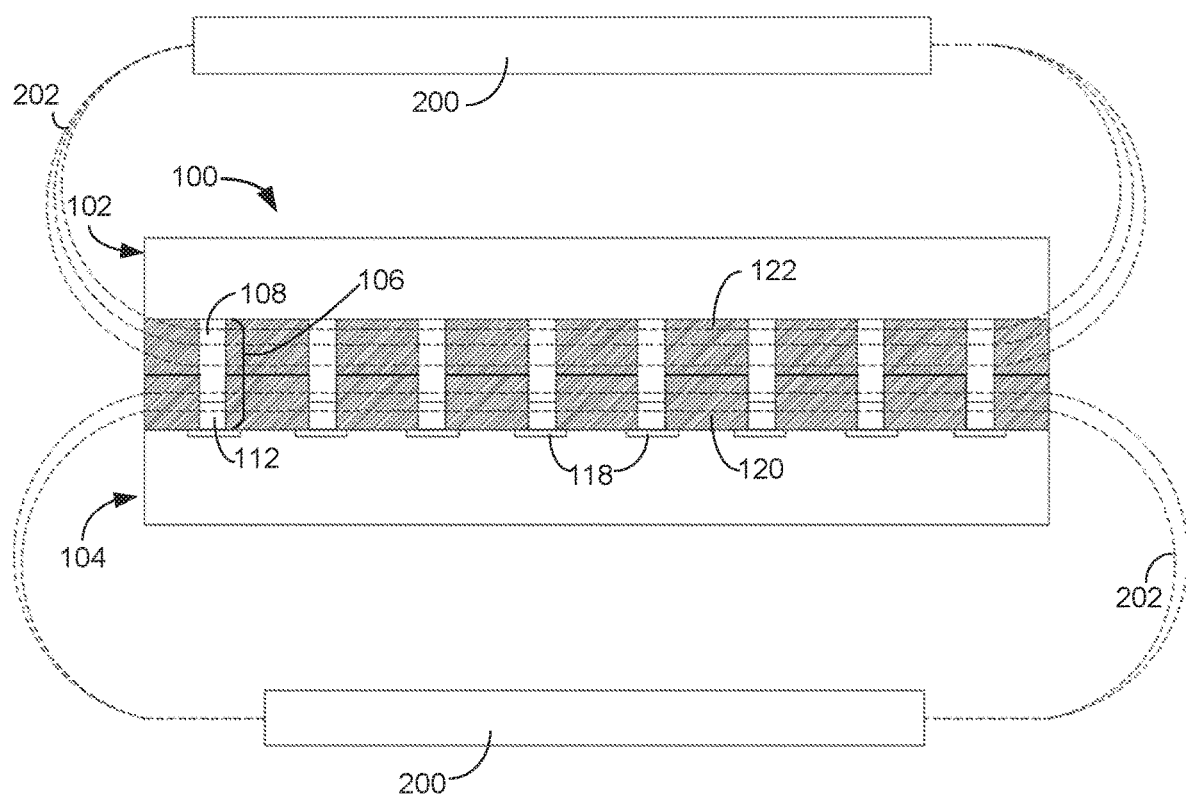

FIGS. 2A-2C illustrate a process for making the electronic assembly 100, in an example embodiment.

At FIG. 2A, the die 102 and the substrate 104 are positioned in proximity of one another within a magnetic field 200 induced by a magnetic source 202, such as an electromagnet. In various examples, the strength of the magnetic field 200 may be selected based on the size of the interconnects 106. In various examples, the strength of the magnetic field 200 is in the range of approximately one (1) to approximately two (2) Tesla.

At FIG. 2B, the conductive magnetic caps 112 are drawn into the holes 204 (see FIG. 2A) in the buildup layer 120 and into contact with the conductive magnetic pads 118 by the force induced on the magnetic materials by the magnetic field 200.

At FIG. 2C, the conductive magnetic caps 112 are secured and electrically and mechanically coupled to the conductive magnetic pads 118 when the underfill 122 layer is dispensed between the die 102 and the substrate 104, enveloping the interconnects 106, and cured. Advantageously, curing the underfill layer 122 in the magnetic field 200 may improve the mechanical properties of the underfill layer 122. Additionally or alternatively, the conductive magnetic caps 112 are secured via alternative mechanisms, such as solder or thermos-compression bonding. After the conductive magnetic caps 112 are secured to the conductive magnetic pads 118 the electric field 200, the electronic assembly 100 may be removed from the magnetic field 200.

Figure 3:
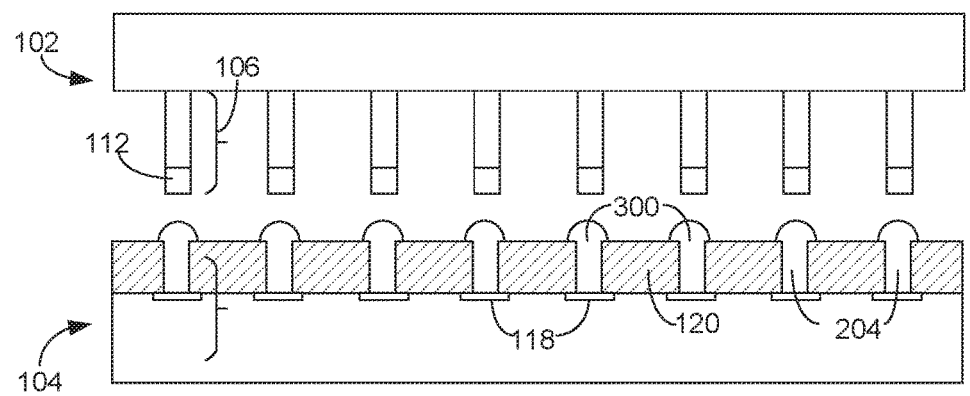
FIG. 3 is a depiction of solder applied during the making of an electronic assembly, in an example embodiment.

FIG. 3 is a depiction of solder 300 applied during the making of the electronic assembly 100, in an example embodiment. The solder 300 is positioned within the holes 204 formed by the buildup layer 120. In the process of FIGS. 2A-2C, the solder 300 may be heated prior to the conductive magnetic caps 112 being drawn into the holes 204 in the buildup layer 120 and into contact with the conductive magnetic pads 118. In such an example, the contact between the conductive magnetic caps 112 and the conductive magnetic pads 118 may not be direct contact but rather may be through the solder 300. Examples of the electronic assembly 100 that do not utilize solder 300 may result in direct contact between the conductive magnetic caps 112 and the conductive magnetic pads 118.

Figure 4:
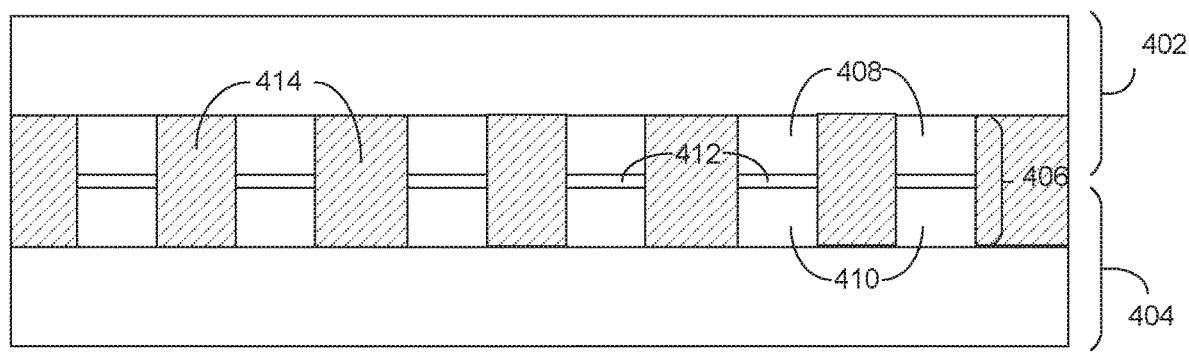
FIG. 4 is an electronic assembly utilizing magnetic components, in an example embodiment.

FIG. 4 is an electronic assembly 400 utilizing magnetic components, in an example embodiment. The electronic assembly 400 is formed utilizing principles described with respect to the electronic assembly 100 but illustrates alternative structures.

The electronic assembly 400 includes a first electronic component 402 and a second electronic component 404, e.g., a die and a substrate, such as a flexible substrate or printed circuit board, respectively, though it is emphasized that the first and second electronic components 402, 404 may be any suitable electronic components as desired. As such, the electronic assembly 400 may be a flexible electronic assembly, an electronic chip, or any other suitable structure. In contrast to the electronic assembly 100, the electronic assembly 400 does not include conductive magnetic pads 118 but rather includes interconnects 406, each including a first part 408 of the first component 402 and a second part 410 of the second electronic component 404. However, it is to be recognized and understood that interconnects 406 on one or both of the first and second parts 402, 404 may be replaced with conductive magnetic pads 118. As illustrated in detail herein, the first parts 408 may be or may include a plurality of first magnetic components and the second parts 410 may be or may include a plurality of second magnetic components.

The electronic assembly 400 is made according to the process illustrated in FIGS. 2A-2C, with the interconnects 406 brought into alignment and contact with one another in the presence of a magnetic field 200. In the illustrated example, the plurality of first magnetic components and the plurality of second magnetic components of the first and second parts 408, 410, respectively, are permanent magnets that are also conductive. In the illustrated example, a conductive film 412, such as an anisotropic conductive film, is positioned between the first and second parts 408, 410 to aid in securing the first and second parts 408, 410 with respect to one another to create the interconnects 406. A nonmagnetic underfill layer 414 is applied between the first and second electronic components 402, 404 and enveloping the interconnects 406, as in FIG. 2C, by substantially covering the interconnects 406 to limit the impact of environmental conditions and to add mechanical stability to the electronic assembly 400.

Figures 5A, 5B:
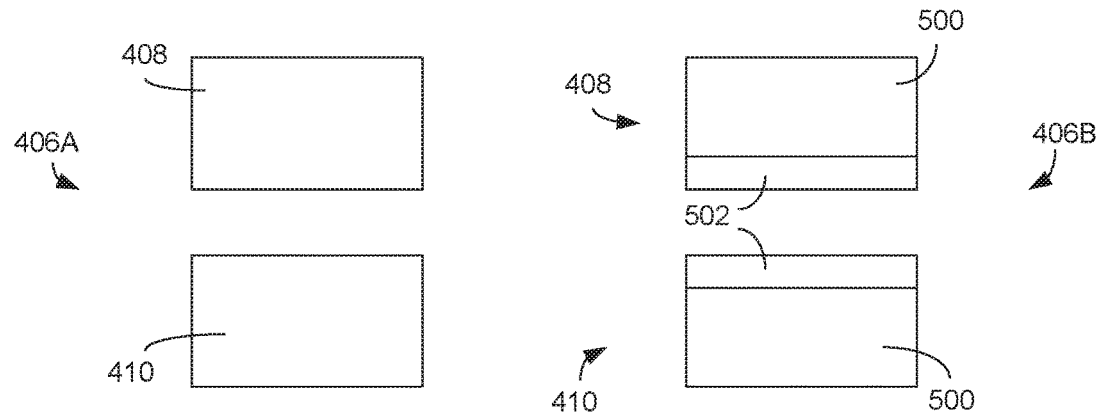
FIGS. 5A and 5B are depictions of examples of an interconnect, in example embodiments.

FIGS. 5A and 5B are depictions of examples of the interconnect 406, in example embodiments. In FIG. 5A, the interconnect 406A is comprised substantially entirely of a permanent magnet, such as samarium-cobalt or iron-neodymium-boron. As such, the first parts 408 are a plurality of first magnetic components and the second parts 410 are a plurality of second magnetic components. In FIG. 5B, each the interconnect 406B is comprised of a first and second nonmagnetic conductor 500, 501 the same or similar to the nonmagnetic conductor 108, while a conductive magnetic cap 502 is comprised of a permanent magnet secured to the nonmagnetic conductor 500, 501 such as by thin film deposition or any other suitable mechanism. As such, the conductive magnetic caps 502 of the first and second parts 408, 410, are the plurality of first magnetic components and a plurality of second magnetic components, respectively.

Figure 6:
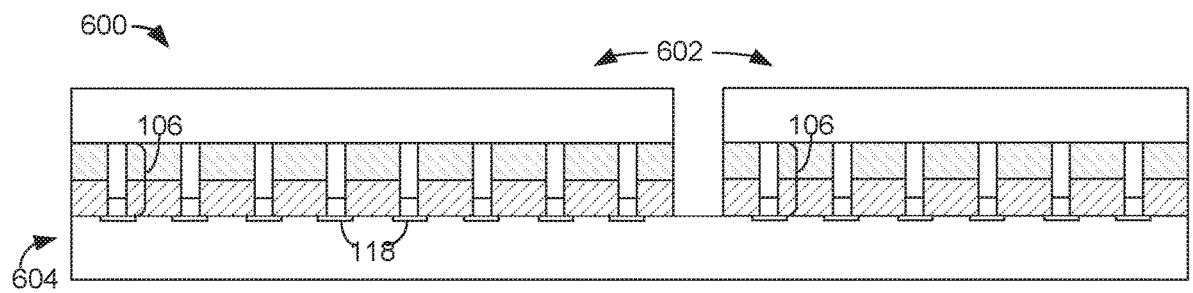
FIG. 6 is a depiction of an electronic assembly including multiple dies on a single substrate, in an example embodiment.

FIG. 6 is a depiction of an electronic assembly 600 including multiple dies 602 on a single substrate 604, in an example embodiment. The electronic assembly may be formed as an embedded multi-die interconnect bridge. The electronic assembly 600 is related to the electronic assembly 100, with the dies 602 being comprised of the same or similar components to that of the die 102. The substrate 604 is formed from the same or similar principles as the substrate 104 except that the substrate 604 includes additional conductive magnetic pads 118 to seat and secure multiple dies 602.

The electronic assembly 600 may be formed according to the process of FIGS. 2A-2C, expanded to include multiple dies 602. In an example, the multiple dies 602 are secured effectively simultaneously, with the single application of the magnetic field 200 causing each interconnect 106 of each die 602 to come into alignment with its respective conductive magnetic pad 118. Alternatively, each die 602 may be applied serially, with the process of FIGS. 2A-2C repeated separately for each die 602.

Figure 7:
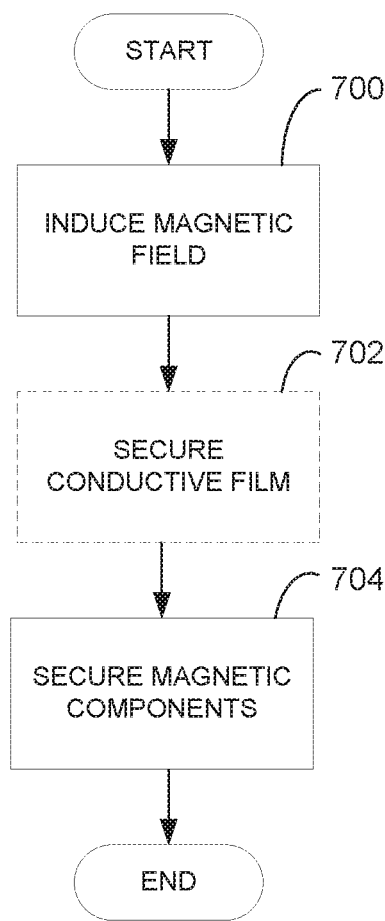
FIG. 7 is a flowchart for making an electronic assembly, in an example embodiment.

FIG. 7 is a flowchart for making an electronic assembly, in an example embodiment. The electronic assembly may be any of the electronic assemblies 100, 400, 600, or any other suitable electronic assembly.

At 700, a magnet a magnetic field is induced between a first electronic component and a second electronic component to cause each of a plurality of first magnetic components of the first electronic component to come into physical alignment with an associated one of a plurality of second magnetic components. In an example, the first electronic component is a die and the plurality of first magnetic components are conductive magnetic caps and are components of a plurality of interconnects of the die, the second electronic component is a substrate and the second plurality of are conductive magnetic pads positioned on a major surface of the substrate, and the plurality of interconnects further comprises a plurality of nonmagnetic conductors, each coupled between the die and an associated one of the conductive magnetic caps. In an example, the first electronic component is one of a plurality of first electronic components, each one of the plurality of first electronic component secured to the substrate by an associated subset of the plurality of interconnects.

In an example, a plurality of interconnects comprise the plurality of first magnetic components and the plurality of second of magnetic components, wherein the plurality of magnetic components are coupled to the first electronic component and each of the second plurality of magnetic components are coupled between the second electronic component and an associated one of the plurality of first magnetic components. In an example, the plurality of first magnetic components and the plurality of second magnetic components are permanent magnets. In an example, each of the plurality of interconnects further comprise a first nonmagnetic conductor coupled between an associated one of the plurality of first magnetic components and the first electronic component and a second nonmagnetic conductor coupled between an associated one of the plurality of second magnetic components and the second electronic component. In an example, wherein at least one of the first and second electronic components is a flexible printed circuit board.

At 702, for each of the plurality of interconnects, a conductive film is optionally secured between an associated one of the plurality of first magnetic components and an associated one of the second plurality of magnetic components At 704, each of plurality of first magnetic components are secured to the associated one of the plurality of second magnetic components to electrically couple the first electronic component to the second electronic component. In an example, securing each of plurality of first magnetic components to the associated one of the plurality of second magnetic components comprises securing the each of the conductive magnetic caps to the associated one of the conductive magnetic pads. In an example, securing the each of the conductive magnetic caps to the associated one of the conductive magnetic pads is by bonding. In an example, securing the each of the conductive magnetic caps to the associated one of the conductive magnetic pads is by soldering.

Figure 8:
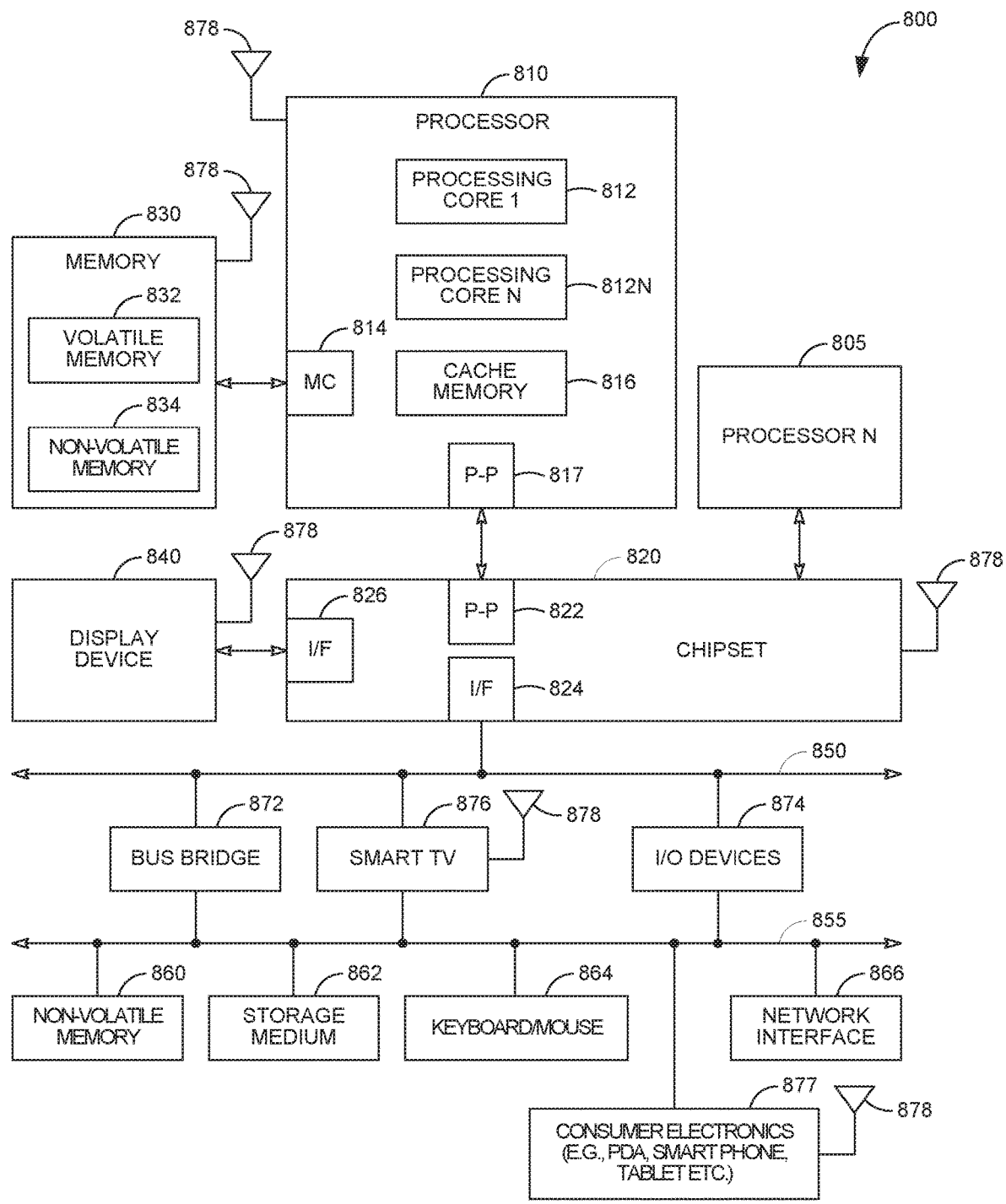
FIG. 8 illustrates a system level diagram, depicting an example of an electronic device (e.g., system) including an electronic chip, in an example embodiment.

FIG. 8 illustrates a system level diagram, depicting an example of an electronic device (e.g., system) including the electronic assembly 100, in an example embodiment. FIG. 8 is included to show an example of a higher-level device application for the electronic assemblies 100, 400, 600. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) [this is the term in Fig—alternative to revise Fig. to "mass storage device(s)"—as used in para. 8] 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

Additional Examples

In Example 1, an electronic assembly includes a first electronic component, a second electronic component, and a plurality of interconnects. The plurality of interconnects electrically couple the first electronic component to the second electronic component. Each of the plurality of interconnects comprise one of a plurality of first magnetic components in physical alignment with an associated one of a plurality of second magnetic components, the plurality of second magnetic components being components of one of the second electronic component and the plurality of interconnects.

In Example 2, the electronic assembly of Example 1 optionally further includes that the first electronic component is a die and the plurality of interconnects are interconnects of the die and that the second electronic component is a substrate and the plurality of second magnetic components of are conductive magnetic pads positioned on a major surface of the substrate.

In Example 3, the electronic assembly of any one or more of Examples 1 and 2 optionally further includes that each of the plurality of interconnects further comprise a nonmagnetic conductor coupled to the die and each of the plurality of first magnetic components is a conductive magnetic cap electrically coupled between the nonmagnetic conductor and the associated one of the conductive magnetic pads.

In Example 4, the electronic assembly of any one or more of Examples 1-3 optionally further includes that the conductive magnetic cap is bonded to the conductive magnetic pad.

In Example 5, the electronic assembly of any one or more of Examples 1-4 optionally further includes that the conductive magnetic cap is soldered to the associated one of the conductive magnetic pads.

In Example 6, the electronic assembly of any one or more of Examples 1-5 optionally further includes that the conductive magnetic pads are diffusion bonded to the conductive magnetic cap of the corresponding one of the plurality of interconnects.

In Example 7, the electronic assembly of any one or more of Examples 1-6 optionally further includes that the conductive magnetic caps are comprised of one of iron, cobalt, nickel, iron-cobalt alloy, iron-nickel alloy, and iron-tin alloy.

In Example 8, the electronic assembly of any one or more of Examples 1-7 optionally further includes that the conductive magnetic cap is plated on the nonmagnetic conductor.

In Example 9, the electronic assembly of any one or more of Examples 1-8 optionally further includes that each of the plurality of conductive magnetic pads is comprised of a nickel surface finish on the major surface.

In Example 10, the electronic assembly of any one or more of Examples 1-9 optionally further includes that the plurality of interconnects further comprise the plurality of second magnetic components, wherein the plurality of first magnetic components are coupled to the first electronic component and each of the second plurality of magnetic components are coupled between the second electronic component and an associated one of the plurality of first magnetic components.

In Example 11, the electronic assembly of any one or more of Examples 1-10 optionally further includes that the plurality of first magnetic components and the plurality of second magnetic components are permanent magnets.

In Example 12, the electronic assembly of any one or more of Examples 1-11 optionally further includes that each of the plurality of interconnects further comprise a first nonmagnetic conductor coupled between an associated one of the plurality of first magnetic components and the first electronic component and a second nonmagnetic conductor coupled between an associated one of the plurality of second magnetic components and the second electronic component.

In Example 13, the electronic assembly of any one or more of Examples 1-12 optionally further includes that each of the plurality of interconnects further comprises a conductive film secured between an associated one of the plurality of first magnetic components and an associated one of the second plurality of magnetic components.

In Example 14, the electronic assembly of any one or more of Examples 1-13 optionally further includes that at least one of the first and second electronic components is a flexible printed circuit board.

In Example 15, the electronic assembly of any one or more of Examples 1-14 optionally further includes that the first electronic component is one of a plurality of first electronic components, each one of the plurality of first electronic component secured to the substrate by an associated subset of the plurality of interconnects.

In Example 16, a method includes inducing with a magnet a magnetic field between a first electronic component and a second electronic component to cause each of a plurality of first magnetic components of the first electronic component to come into physical alignment with an associated one of a plurality of second magnetic components and securing each of plurality of first magnetic components to the associated one of the plurality of second magnetic components to electrically couple the first electronic component to the second electronic component.

In Example 17, the method of Example 16 optionally further includes that the first electronic component is a die and the plurality of first magnetic components are conductive magnetic caps and are components of a plurality of interconnects of the die, the second electronic component is a substrate and the second plurality of are conductive magnetic pads positioned on a major surface of the substrate, the plurality of interconnects further comprises a plurality of nonmagnetic conductors, each coupled between the die and an associated one of the conductive magnetic caps, and securing each of plurality of first magnetic components to the associated one of the plurality of second magnetic components comprises securing the each of the conductive magnetic caps to the associated one of the conductive magnetic pads.

In Example 18, the method of any one or more of examples 16 and 17 optionally further includes that securing the each of the conductive magnetic caps to the associated one of the conductive magnetic pads is by bonding.

In Example 19, the method of any one or more of examples 16-18 optionally further includes that securing the each of the conductive magnetic caps to the associated one of the conductive magnetic pads is by soldering.

In Example 20, the method of any one or more of examples 16-19 optionally further includes that a plurality of interconnects comprise the plurality of first magnetic components and the plurality of second of magnetic components, wherein the plurality of magnetic components are coupled to the first electronic component and each of the second plurality of magnetic components are coupled between the second electronic component and an associated one of the plurality of first magnetic components.

In Example 21, the method of any one or more of examples 16-20 optionally further includes that the plurality of first magnetic components and the plurality of second magnetic components are permanent magnets.

In Example 22, the method of any one or more of examples 16-21 optionally further includes that each of the plurality of interconnects further comprise a first nonmagnetic conductor coupled between an associated one of the plurality of first magnetic components and the first electronic component and a second nonmagnetic conductor coupled between an associated one of the plurality of second magnetic components and the second electronic component.

In Example 23, the method of any one or more of examples 16-22 optionally further includes that each of the plurality of interconnects further comprises a conductive film secured between an associated one of the plurality of first magnetic components and an associated one of the second plurality of magnetic components.

In Example 24, the method of any one or more of examples 16-23 optionally further includes that at least one of the first and second electronic components is a flexible printed circuit board.

In Example 25, the method of any one or more of examples 16-24 optionally further includes that the first electronic component is one of a plurality of first electronic components, each one of the plurality of first electronic component secured to the substrate by an associated subset of the plurality of interconnects.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic assembly, comprising:
   a first electronic component;
   a second electronic component; and
   a plurality of interconnects, electrically coupling the first electronic component to the second electronic component, each of the plurality of interconnects comprising one of a plurality of first magnetic components in physical alignment with an associated one of a plurality of second magnetic components, the plurality of second magnetic components being components of one of the second electronic component and the plurality of interconnects;
   wherein the first electronic component is a die and the plurality of interconnects are interconnects of the die; and
   wherein the second electronic component is a substrate and the plurality of second magnetic components of are conductive magnetic pads positioned on a major surface of the substrate;
   wherein each of the plurality of interconnects further comprise a nonmagnetic conductor coupled to the die and each of the plurality of first magnetic components is a conductive magnetic cap electrically coupled between the nonmagnetic conductor and the associated one of the conductive magnetic pads.

2. The electronic assembly of claim 1, wherein the conductive magnetic cap is bonded to the associated one of the conductive magnetic pads.

3. The electronic assembly of claim 1, wherein the conductive magnetic cap is soldered to the associated one of the conductive magnetic pads.

4. The electronic assembly of claim 1, wherein the conductive magnetic pads are diffusion bonded to the conductive magnetic cap of the corresponding one of the plurality of interconnects.

5. The electronic assembly of claim 1, wherein the conductive magnetic caps are comprised of one of iron, cobalt, nickel, iron-cobalt alloy, iron-nickel alloy, and iron-tin alloy.

6. The electronic assembly of claim 1, wherein the conductive magnetic cap is plated on the nonmagnetic conductor.

7. The electronic assembly of claim 1, wherein each of the plurality of conductive magnetic pads is comprised of a nickel surface finish on the major surface.

8. The electronic assembly of claim 1, wherein the plurality of interconnects further comprise the plurality of second magnetic components, wherein the plurality of first magnetic components are coupled to the first electronic component and each of the second plurality of magnetic components are coupled between the second electronic component and an associated one of the plurality of first magnetic components.

* * * * *